(12) United States Patent
Qiu et al.

(10) Patent No.: US 8,420,281 B2
(45) Date of Patent: Apr. 16, 2013

(54) EPOXY-FUNCTIONALIZED PERFLUOROPOLYETHER POLYURETHANES

(75) Inventors: Zai-Ming Qiu, Woodbury, MN (US); John C. Hulteen, Afton, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 571 days.

(21) Appl. No.: 12/561,113

(22) Filed: Sep. 16, 2009

(65) Prior Publication Data

US 2011/0065045 A1    Mar. 17, 2011

(51) Int. Cl.
*G03F 1/14*    (2011.01)
*G03F 7/20*    (2006.01)

(52) U.S. Cl.
USPC .............................................. 430/5; 430/311

(58) Field of Classification Search .................. None
See application file for complete search history.

(56) References Cited

U.S. PATENT DOCUMENTS

| | | | |
|---|---|---|---|
| 3,131,161 A | 4/1964 | Nitzsche et al. | |
| 3,250,808 A | 5/1966 | Moore, Jr. | |
| 3,753,755 A | 8/1973 | Olson | |
| 3,875,045 A | 4/1975 | Bergrahm | |
| 4,000,115 A | 12/1976 | Jacobs | |
| 4,025,348 A | 5/1977 | Tsukada et al. | |
| 4,025,407 A | 5/1977 | Chang et al. | |
| 4,049,861 A | 9/1977 | Nozari | |
| 4,058,401 A | 11/1977 | Crivello | |
| 4,069,055 A | 1/1978 | Crivello | |
| 4,094,911 A | 6/1978 | Mitsch | |
| 4,100,134 A | 7/1978 | Robins et al. | |
| 4,101,513 A | 7/1978 | Fox et al. | |
| 4,130,690 A | 12/1978 | Lien et al. | |
| 4,156,035 A | 5/1979 | Tsao et al. | |
| 4,156,046 A | 5/1979 | Lien et al. | |
| 4,161,478 A | 7/1979 | Crivello | |
| 4,267,302 A | 5/1981 | Ohmori | |
| 4,279,717 A | 7/1981 | Eckberg | |
| 4,293,606 A | 10/1981 | Zollinger et al. | |
| 4,333,998 A | 6/1982 | Leszyk | |
| 4,337,107 A | 6/1982 | Eshleman | |
| 4,348,462 A | 9/1982 | Chung | |
| 4,353,980 A | 10/1982 | Helling et al. | |
| 4,399,192 A | 8/1983 | Russell | |
| 4,426,431 A | 1/1984 | Harasta et al. | |
| 4,504,401 A * | 3/1985 | Matsuo et al. ................ 252/8.62 | |
| 4,508,916 A | 4/1985 | Newell | |
| 4,623,676 A | 11/1986 | Kistner | |
| 4,647,413 A | 3/1987 | Savu | |
| 4,818,801 A | 4/1989 | Rice et al. | |
| 4,830,910 A | 5/1989 | Larson | |
| 4,959,426 A | 9/1990 | Re et al. | |
| 5,021,501 A | 6/1991 | Ohmori et al. | |
| 5,073,404 A | 12/1991 | Huang | |
| 5,274,159 A | 12/1993 | Pellerite | |
| 5,340,898 A | 8/1994 | Cavezzan et al. | |
| 5,514,728 A | 5/1996 | Lamanna et al. | |
| 5,554,664 A | 9/1996 | Lamanna et al. | |
| 5,576,095 A | 11/1996 | Ueda et al. | |
| 5,723,860 A | 3/1998 | Hamada | |
| 5,980,992 A | 11/1999 | Kistner | |
| 6,187,834 B1 | 2/2001 | Thayer | |
| 6,190,743 B1 | 2/2001 | Wang | |
| 6,204,350 B1 | 3/2001 | Liu | |
| 6,344,526 B1 | 2/2002 | Noguchi | |
| 6,361,870 B1 | 3/2002 | Steffl | |
| 6,448,346 B1 | 9/2002 | Noguchi et al. | |
| 6,559,541 B2 * | 5/2003 | Itagaki et al. ................ 257/738 |
| 6,646,088 B2 * | 11/2003 | Fan et al. ........................ 528/30 |
| 6,678,495 B1 | 1/2004 | Badesha | |
| 6,753,380 B2 * | 6/2004 | Qiu ............................. 525/200 |
| 6,767,946 B2 * | 7/2004 | Shimada et al. ............. 524/212 |
| 6,803,109 B2 * | 10/2004 | Qiu et al. .................... 428/423.1 |
| 6,811,931 B1 | 11/2004 | Fujioka | |
| 7,037,585 B2 | 5/2006 | Treadway | |
| 7,097,910 B2 | 8/2006 | Moore | |
| 7,166,329 B2 | 1/2007 | Dams | |

(Continued)

FOREIGN PATENT DOCUMENTS

DE       10004132        8/2001
EP       212319 A2       3/1987

(Continued)

OTHER PUBLICATIONS

Yarbrough et al., "Contact Angle Analysis, Surface Dynamics, and Biofouling Characteristics of Cross-Linkable, Random Perfluoropolyether-Based Graft Terpolymers", Macromolecules, 2006, pp. 2521-2528, vol. 39, No. 7, American Chemical Society.
Search Report for PCT/US2010/048876, 4 pgs, dated Jun. 3, 2011.
Bongiovanni et al., "Fluorinated Additives in Cationic Photopolymerization," In: Radtech Europe, Berlino, Nov. 3-5, 2003. pp. 661-667.
Bongiovanni, "Use of Fluorinated Compounds in Cationic UV-curing," Photochemistry and UV Curing: New Trends, 2006, pp. 279-292.
Bongiovanni, "Fluorinated Additives in Cationic Photopolymerization," RadTech Europe, [online], [retrived from the internet on Oct. 6, 2011], website no longer available, www.radtech-europe.com/filescontent/september%202004%20papers/bongiovannipaperseptember2004.pdf, 7 pages.

(Continued)

*Primary Examiner* — Cynthia Hamilton
(74) *Attorney, Agent, or Firm* — Robert W. Sprague

(57) ABSTRACT

Disclosed are epoxy-functionalized perfluoropolyether polyurethane compounds having the following general structure $(R_fQX_1C(O)NH)_m$—$R_i$—$(NHC(O)X_2Q(E)_o)_n$ wherein $R_f$ is a monovalent perfluoropolyether moiety; Q is independently a connecting group of valence at least 2, which may contain heteroatoms; $X_1$ is O, S, or NR, wherein R is H or a lower alkyl of 1 to 4 carbon atoms; $R_i$ is a residue of a multi-isocyanate; $X_2$ is O, S, or NR, wherein R is a lower alkyl of 1 to 4 carbon atoms; E is an organic group having at least one oxirane ring; m is at least 1; n is at least 1; o is 1, 2 or 3; and m+n is from 2 to 10.

17 Claims, No Drawings

U.S. PATENT DOCUMENTS

| | | | |
|---|---|---|---|
| 7,189,479 | B2 | 3/2007 | Lu |
| 7,335,786 | B1 | 2/2008 | Iyer |
| 7,495,118 | B2 | 2/2009 | Dams |
| 7,718,264 | B2 | 5/2010 | Klun et al. |
| 7,728,098 | B2 | 6/2010 | Dams |
| 7,745,653 | B2 | 6/2010 | Iyer |
| 7,825,272 | B2 | 11/2010 | Iyer |
| 7,897,678 | B2 | 3/2011 | Qiu |
| 8,002,886 | B2 | 8/2011 | Clark |
| 8,015,970 | B2 | 9/2011 | Klun |
| 2003/0207963 | A1 | 11/2003 | Zang et al. |
| 2004/0077775 | A1 | 4/2004 | Audenaert et al. |
| 2004/0092675 | A1 | 5/2004 | Moore |
| 2004/0147188 | A1 | 7/2004 | Johnson |
| 2005/0037932 | A1 | 2/2005 | Liu et al. |
| 2005/0040561 | A1* | 2/2005 | Kubo et al. ............ 264/300 |
| 2005/0042553 | A1 | 2/2005 | Lu |
| 2005/0054804 | A1 | 3/2005 | Dams |
| 2005/0121644 | A1 | 6/2005 | Dams |
| 2005/0164010 | A1 | 7/2005 | Trombetta |
| 2005/0196626 | A1 | 9/2005 | Knox |
| 2005/0196696 | A1 | 9/2005 | King |
| 2005/0233103 | A1 | 10/2005 | Enomoto |
| 2006/0147177 | A1 | 7/2006 | Jing |
| 2006/0148350 | A1 | 7/2006 | Chang |
| 2006/0153993 | A1 | 7/2006 | Schmidt |
| 2006/0154091 | A1 | 7/2006 | Schmidt |
| 2006/0165919 | A1 | 7/2006 | Suzuki |
| 2006/0216524 | A1 | 9/2006 | Klun |
| 2006/0228560 | A1 | 10/2006 | Stewart |
| 2007/0014927 | A1 | 1/2007 | Buckanin |
| 2007/0128557 | A1 | 6/2007 | Lu |
| 2007/0275171 | A1 | 11/2007 | Dang |
| 2007/0287093 | A1 | 12/2007 | Jing et al. |
| 2008/0041272 | A1 | 2/2008 | Tomasino |
| 2008/0075947 | A1 | 3/2008 | Padiyath |
| 2008/0124555 | A1 | 5/2008 | Klun et al. |
| 2009/0025608 | A1 | 1/2009 | Qiu |
| 2009/0025727 | A1 | 1/2009 | Klun et al. |
| 2009/0148711 | A1 | 6/2009 | LeBlanc |
| 2010/0092686 | A1 | 4/2010 | Laryea et al. |
| 2010/0160595 | A1 | 6/2010 | Klun et al. |
| 2011/0008733 | A1 | 1/2011 | Qiu |
| 2011/0020657 | A1 | 1/2011 | Chang |
| 2011/0027702 | A1 | 2/2011 | Qiu |
| 2011/0065045 | A1 | 3/2011 | Qiu |

FOREIGN PATENT DOCUMENTS

| | | | |
|---|---|---|---|
| EP | 271872 | | 6/1988 |
| EP | 572179 | | 12/1993 |
| EP | 1 083 205 | A1 | 3/2001 |
| EP | 1225187 | | 7/2002 |
| EP | 1225188 | | 7/2002 |
| EP | 1 411 073 | A1 * | 4/2004 |
| FR | 2886309 | | 12/2006 |
| JP | 63-196621 | A * | 8/1988 |
| JP | 02-232251 | | 9/1990 |
| JP | 05-32867 | A * | 2/1993 |
| JP | 10176139 | | 6/1998 |
| JP | 2004250517 | | 9/2004 |
| JP | 2005046767 | | 2/2005 |
| JP | 2006169328 | | 6/2006 |
| KR | 10-2006-0080182 | | 7/2006 |
| WO | WO 03/055954 | | 7/2003 |
| WO | WO-03/072625 | A1 * | 9/2003 |
| WO | WO 2004/024790 | | 3/2004 |
| WO | WO 2004/056495 | A1 | 7/2004 |
| WO | WO 2005/014742 | A1 | 2/2005 |
| WO | WO 2005/023822 | | 3/2005 |
| WO | WO 2006/030721 | | 3/2006 |
| WO | WO 2006/074033 | | 7/2006 |
| WO | WO 2008/131715 | | 11/2008 |
| WO | WO 2009/035874 | | 3/2009 |
| WO | WO-2009/069974 | A2 * | 6/2009 |
| WO | WO 2009/069974 | A2 | 6/2009 |
| WO | WO 2009/083564 | A1 | 7/2009 |
| WO | WO 2009/086515 | A2 | 7/2009 |
| WO | WO 2009/114572 | | 9/2009 |
| WO | WO-2009/114572 | A2 * | 9/2009 |
| WO | WO 2009/114580 | | 9/2009 |
| WO | WO-2009/114580 | A2 * | 9/2009 |
| WO | WO 2011/011167 | | 1/2011 |
| WO | WO 2011/034845 | | 3/2011 |
| WO | WO 2011/034847 | | 3/2011 |

OTHER PUBLICATIONS

Coggio, "New Durable, Soil Resistant Optical Film for Front Surface Protection of Flat-Panel Displays", Digest of Technical Papers, Society for Information Display International Symposium, 2005, vol. 36, pp. 175-177.

"Epoxide", source unknown, date unknown but believed to be prior to the date of the filing of the present application, 4 pages.

"Epoxy Resins", source unknown, date unknown but believed to be prior to the date of the filing of the present application, 4 pages.

"Mask Process", PKL, 1997, Choongnam, Korea, [online], [retrieved from the internet on Feb. 25, 2008], URL <www.pkl.co.kr/english/product/product05.html>, 3 pages.

Physical Review E, Statistical Physics, Plasmas, Fluids, and Related Interdisciplinary Topics, Feb. 1999, Part A, Third Series, vol. 59, No. 2, 5 pages.

Sangermano, "Fluorinated Alcohols as Surface-Active Agents in Cationic Photopolymerization of Epoxy Monomers", Journal of Polymer Science: Part A: Polymer Chemistry, Feb. 2006, vol. 43, pp. 4144-4150.

Sangermano, "Fluorinated Hyperbranched Polymers as Additives in Cationic Photopolymerization", Macromolecular Materials and Engineering, 2004, vol. 289, No. 8, pp. 722-727.

Sangermano, "Synthesis and Cationic Photopolymerization of a New Fluorinated Oxetane Monomer", Polymer, 2004, vol. 45, No. 7, pp. 2133-2139.

Sangermano, "Synthesis and Cationic Photopolymerization of New Fluorinated Polyfunctional Propenyl Ether Oligomers", Journal of Polymer Science, Part A: Polymer Chemistry, 2006, vol. 44, pp. 6943-6951.

Intl Search Report for PCT/US2010/048876, mailed May 24, 2011, 4 pages.

\* cited by examiner

EPOXY-FUNCTIONALIZED PERFLUOROPOLYETHER POLYURETHANES

FIELD

This invention relates to epoxy-functionalized perfluoropolyether polyurethane compounds and to hardcoat compositions comprising the compounds.

BACKGROUND

In the printed circuit industry, photographic masks or stencils bearing a circuit pattern are known as phototools. Such a stencil, through which a photoresist can be exposed, provides an intricate complex image representing an electrical circuit. The image often consists of many fine lines and junctions spaced closely together. During its use to make printed circuit boards, the phototool is placed face down on a photoresist layer and a contact print is made by exposing the photoresist to high intensity light through the phototool. In this way, a single phototool can be used to make multiple contact prints.

After processing, a phototool must be carefully inspected through a microscope to ensure that there are no breaks in the fine lines of the image. The continued use of the phototool can cause tiny scratches and abrasions on the phototool surface. The photoresists on which the phototool is placed are usually laminated on sheet copper and small burrs or rough edges of the copper sheet can cause scratches as the phototool is transferred from one photoresist to the next. The phototool is also frequently wiped with a soft cloth to make sure it is dust and lint free. Small particles of dirt can cause scratching as they are wiped across the phototool surface. Because of this general wear and tear on the phototool surfaced during normal use, the phototool must be frequently inspected to ensure line continuity. Depending upon the size and the intricacy of the phototool, such microscopic inspections can take 2 to 3 hours.

Due to the fact that phototools are vulnerable to scratching and that abrasion is a serious problem during the normal use of a phototool, protective films and overcoats are often employed to protect the phototool. For example, polyester films coated with various kinds of pressure sensitive adhesives have been laminated to image-bearing surfaces to protect the image. Because of their thickness, however, laminating films can cause optical distortion and hence loss of resolution. Thinner protective coatings can be obtained by coating the surfaces of phototools with liquid compositions. After application, the thin liquid coating is hardened to yield the desired protective coat. Epoxy silanes and acrylate esters (for example, polyurethane acrylates) are useful in such coatings because of their resistance to abrasion. Many protective overcoats have limited release properties, however, and can therefore stick to the surface of the photoresist, particularly when relatively sticky materials such as high viscosity solder mask inks are present.

SUMMARY

In view of the foregoing, we recognize that there is a need for curable compounds that can be used in hardcoat compositions to protect surfaces and objects from scratching and abrasion. We also recognize that for phototool applications, it would be advantageous if protective layers comprising the hardcoat compositions release easily from relatively sticky materials such as solder mask inks.

Briefly, in one aspect, the present invention provides an epoxy-functionalized perfluoropolyether polyurethane compound having the following general structure:

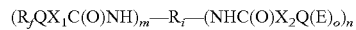

wherein:

$R_f$ is a monovalent perfluoropolyether moiety;

Q is independently a connecting group of valence at least 2, which may contain heteroatoms;

$X_1$ is O, S, or NR, wherein R is H or a lower alkyl of 1 to 4 carbon atoms;

$R_i$ is a residue of a multi-isocyanate;

$X_2$ is O, S, or NR, wherein R is a lower alkyl of 1 to 4 carbon atoms;

E is an organic group having at least one oxirane ring;

m is at least 1; n is at least 1; o is 1, 2 or 3; and m+n is from 2 to 10.

In another aspect, the present invention provides hardcoat compositions comprising (a) one or more epoxy silane compounds, (b) one more or of the epoxy-functionalized perfluoropolyether polyurethane compounds of the invention, and (c) photo-acid generator.

The hardcoat compositions of the invention can provide abrasion-resistance, hardness, clarity, low surface energy with low adhesion, release properties, anti-reflection, resistance to staining and soiling, and repellency to stains, soils, solvents, oil, and water. Protective layers comprising the cured hardcoat compositions can be used to protect various hard substrates. They are particularly well-suited for protecting phototools from scratching and abrasion. Protective layers comprising the cured hardcoat compositions of the invention have good release properties and therefore do not stick to photoresist surfaces even when sticky materials such as high viscosity solder masks are present. Phototools with protective layers comprising the cured hardcoat compositions of the invention can advantageously be used to make multiple contact prints (for example, 5 times or more (preferably, 10 times or more; more preferably, 20 times or more)).

Cured protective layers formed from the hardcoat compositions of the invention have low surface energy with receding water contact angles greater than about 50° (preferably, greater than about 55'; more preferably, greater than about 60°) and receding hexadecane contact angles greater than about 50° (preferably, greater than about 55°; more preferably, greater than about 60°). The protective layer also exhibits good release properties/low peel force.

DETAILED DESCRIPTION

Epoxy-Functionalized Perfluoropolyether Polyurethane Compounds

The epoxy-functionalized perfluoropolyether polyurethanes of the invention have the following general structure:

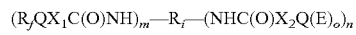

wherein:

$R_f$ is a monovalent perfluoropolyether moiety;

Q is independently a connecting group of valence at least 2, which may contain heteroatoms such as —O—, —S— and —$NR_3$—, and the like, wherein $R_3$ is a lower alkyl of 1 to 4 carbon atoms;

$X_1$ is O, S, or NR, wherein R is H or a lower alkyl of 1 to 4 carbon atoms;

$R_i$ is a residue of a multi-isocyanate;

$X_2$ is O, S, or NR, wherein R is a lower alkyl of 1 to 4 carbon atoms;

E is an organic group having at least one oxirane ring;
m is at least 1; n is at least 1; o is 1, 2 or 3; and
m+n is from 2 to 10.

The perfluoropolyether group $R_f$ can be linear, branched, cyclic, or combinations thereof and can be saturated or unsaturated. The perfluoropolyether has at least two catenated oxygen heteroatoms. Exemplary perfluoropolyethers include, but are not limited to, those that have perfluorinated repeating units selected from the group of $-(C_pF_{2p})-$, $-(C_pF_{2p}O)-$, $-(CF(Z))-$, $-(CF(Z)O)-$, $-(CF(Z)C_pF_{2p}O)-$, $-(C_pF_{2p}CF(Z)O)-$, $-(CF_2CF(Z)O)-$, or combinations thereof. In these repeating units, p is typically an integer of 1 to 10. In some embodiments, p is an integer of 1 to 8, 1 to 6, 1 to 4, 1 to 3, or 1 to 2. The group Z is a fluorine atom, perfluoroalkyl group, perfluoroether group, nitrogen-containing perfluoroalkyl group, perfluoropolyether, or a perfluoroalkoxy group, all of which can be linear, branched, or cyclic. The Z group typically has no more than 12 carbon atoms, no more than 10 carbon atoms, or no more than 9 carbon atoms, no more than 4 carbon atoms, no more than 3 carbon atoms, no more than 2 carbon atoms, or no more than 1 carbon atom. In some embodiments, the Z group can have no more than 4, no more than 3, no more than 2, no more than 1, or no oxygen atoms. In these perfluoropolyether structures, the different repeat units can be distributed randomly along the chain.

In some compounds where $R_f$ is monovalent, the terminal groups can be $(C_pF_{2p+1})-$, $(C_pF_{2p+1}O)-$, $(X'C_pF_{2p}O)-$, or $(X'C_pF_{2p+1})-$ where X' is hydrogen, chlorine, or bromine and p is an integer of 1 to 10. In some embodiments of monovalent $R_f$ groups, the terminal group is perfluorinated and p is an integer of 1 to 10, 1 to 8, 1 to 6, 1 to 4, or 1 to 3. Exemplary monovalent $R_f$ groups include $CF_3O(C_2F_4O)_rCF_2-$, and $C_3F_7O(CF(CF_3)CF_2O)_rCF(CF_3)-$ wherein r has an average value of 0 to 50, 1 to 50, 3 to 30, 3 to 15, or 3 to 10.

Suitable structures for $R_f$ groups include, but are not limited to, $R_f'-CF_2O(CF_2O)_q(C_2F_4O)_rCF_2-$, $R_f'-(CF_2)_3O(C_4F_8O)_r(CF_2)_3-$, $R_f'-CF_2O(C_2F_4O)_rCF_2-$, and $R_f'-CF(CF_3)(OCF_2CF(CF_3))_sOC_fF_{2t}O(CF(CF_3)CF_2O)_rCF(CF_3)-$, wherein $R_f'$ is F or a perfluoroalkyl group; q has an average value of 0 to 50, 1 to 50, 3 to 30, 3 to 15, or 3 to 10; r has an average value of 0 to 50, 3 to 30, 3 to 15, or 3 to 10; s has an average value of 0 to 50, 1 to 50, 3 to 30, 3 to 15, or 3 to 10; the sum (r+s) has an average value of 0 to 50 or 4 to 40; the sum (q+r) is greater than 0; and t is an integer of 2 to 6.

As synthesized, compounds typically include a mixture of $R_f$ groups. The average structure is the structure averaged over the mixture components. The values of q, n, and s in these average structures can vary, as long as the compound has a number average molecular weight of at least about 300. Useful compounds often have a molecular weight (number average) of 400 to 5000, 800 to 4000, or 1000 to 5000.

Preferably, $R_f$ is the oligomer of hexafluoropropylene oxide (HFPO) with a number average molecular weight at least 1,000.

Preferably, Q is $-CH_2-$, $-CH_2CH_2-$, $-C(O)NHCH_2CH_2-$, $-CH_2OCH_2CH_2-$, or $-CH_2OCH_2CH_2OCH_2CH_2-$.

Preferably, $X_1$ is O or S.
Preferably, $R_i$ is $-(CH_2)_6-$,

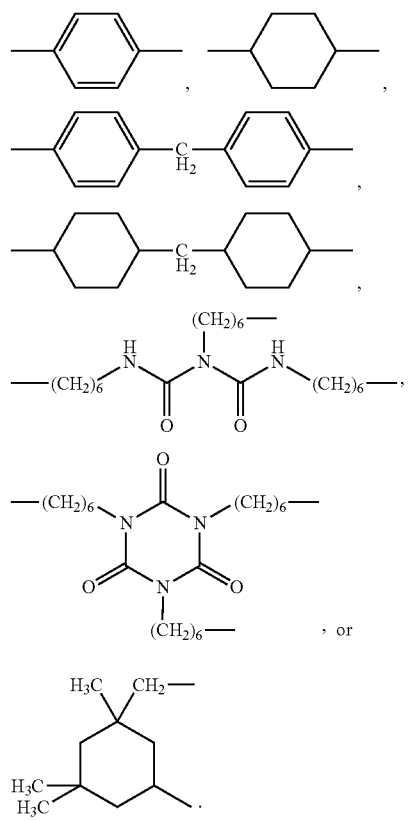

Preferably, $X_2$ is O.
Preferred epoxy-functionalized perfluoropolyether polyurethanes of the invention include, for example,

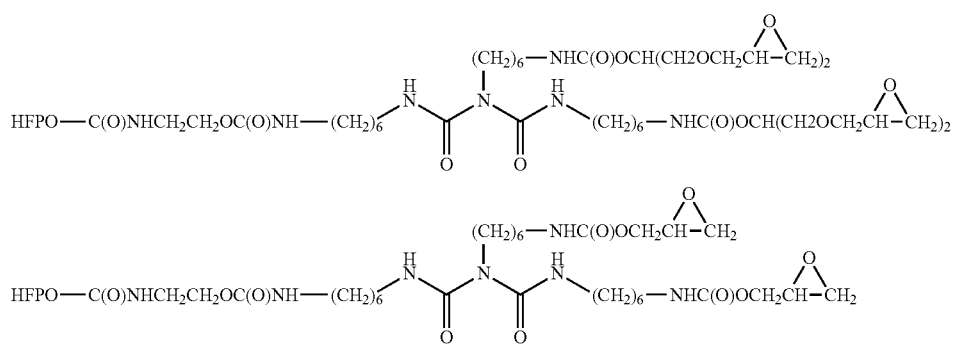

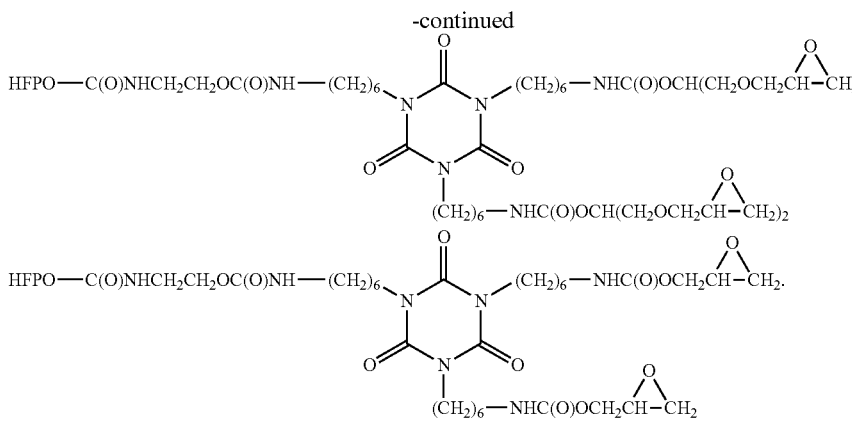

and

The epoxy-functionalized perfluoropolyether polyurethanes of the invention can be prepared by reacting a polyisocyanate compound with at least one isocyanate reactive epoxide, $H-X_2Q(E)_o$, (e.g. epoxy-alcohol), and at least one isocyanate reactive perfluoropolyether, $R_f-QX_1-H$ (e.g. perfluoropolyether-alcohol).

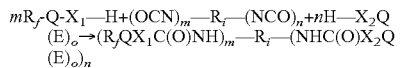

Polyisocyanate compounds useful in preparing the epoxy-functionalized perfluoropolyether polyurethanes of the invention include isocyanate radicals attached to the multivalent organic groups ($R_i$) that can include a multivalent aliphatic, alicyclic, or aromatic moiety, or a multivalent aliphatic, alicyclic or aromatic moiety attached to a biuret, an isocyanurate, or a uretdione, and mixtures thereof. Preferred polyfunctional isocyanate compounds include an average of at least two isocyanate (—NCO) radicals. Compounds that include at least two —NCO radicals preferably include di- and trivalent aliphatic, alicyclic, araliphatic, or aromatic groups to which the —NCO radicals are attached. Aliphatic di- or trivalent groups are preferred.

Representative examples of suitable polyisocyanate compounds include isocyanate functional derivatives of the polyisocyanate compounds as defined herein. Useful isocyanate functional derivatives include, e.g., ureas, biurets, allophanates, dimers, and trimers (such as uretdiones and isocyanurates) of isocyanate compounds, and mixtures thereof. Any suitable organic polyisocyanate including, e.g., aliphatic, alicyclic, araliphatic, and aromatic polyisocyanates, can be used either singly or in mixtures of at least two.

Suitable aromatic polyisocyanate compounds include, e.g., 2,4-toluene diisocyanate (TDI), 2,6-toluene diisocyanate, an adduct of TDI with trimethylolpropane (commercially available under the DESMODUR CB trade designation from Bayer Corporation, (Pittsburgh, Pa.)), the isocyanurate trimer of TDI (commercially available under the DESMODUR IL trade designation from Bayer Corporation (Pittsburgh, Pa.), diphenylmethane 4,4'-diisocyanate (MDI), diphenylmethane 2,4'-diisocyanate, 1,5-diisocyanato-naphthalene, 1,4-phenylene diisocyanate, 1,3-phenylene diisocyanate, 1-methoxy-2,4-phenylene diisocyanate, 1-chlorophenyl-2,4-diisocyanate, and mixtures thereof.

Examples of useful alicyclic polyisocyanate compounds include dicyclohexylmethane diisocyanate ($H_{12}MDI$), which is commercially available under the DESMODUR trade designation from Bayer Corporation, 4,4'-isopropyl-bis(cyclohexylisocyanate), isophorone diisocyanate (IPDI), cyclobutane-1,3-diisocyanate, cyclohexane 1,3-diisocyanate, cyclohexane 1,4-diisocyanate (CHDI), 1,4-cyclohexanebis (methylene isocyanate) (BDI), dimer acid diisocyanate (available from Bayer Corporation), 1,3-bis(isocyanatomethyl)cyclohexane ($H_6XDI$), 3-isocyanatomethyl-3,5,5-trimethylcyclohexyl isocyanate, and mixtures thereof.

Examples of useful aliphatic polyisocyanate compounds include tetramethylene 1,4-diisocyanate, hexamethylene 1,4-diisocyanate, hexamethylene 1,6-diisocyanate (HDI), octamethylene 1,8-diisocyanate, 1,12-diisocyanatododecane, 2,2,4-trimethyl-hexamethylene diisocyanate (TMDI), 2-methyl-1,5-pentamethylene diisocyanate, dimer diisocyanate, the urea of hexamethylene diisocyanate, the biuret of hexamethylene 1,6-diisocyanate (HDI) (e.g., commercially available under the DESMODUR N-100 and N-3200 trade designations from Bayer Corporation), the isocyanurate of HDI (commercially available under the DESMODUR N-3300 and DESMODUR N-3600 trade designations from Bayer Corporation), a blend of the isocyanurate of HDI and the uretdione of HDI (commercially available under the DESMODUR N-3400 trade designation from Bayer Corporation), and mixtures thereof.

Examples of useful araliphatic polyisocyanates include m-tetramethyl xylylene diisocyanate (m-TMXDI), p-tetramethyl xylylene diisocyanate (p-TMXDI), 1,4-xylylene diisocyanate (XDI), 1,3-xylylene diisocyanate, p-(1-isocyanatoethyl)phenyl isocyanate, m-(3-isocyanatobutyl)phenyl isocyanate, 4-(2-isocyanatocyclohexyl-methyl)phenyl isocyanate, and mixtures thereof.

Preferred polyisocyanates include, e.g., DESMODUR N-100, N-3200, N-3300, N-3600, N-3400, and mixtures thereof.

Useful isocyanate reactive perfluoropolyethers for preparing the epoxy-functionalized perfluoropolyether polyurethanes of the invention include $R_fC(O)NHCH_2CH_2OH$, $R_fC(O)NHCH_2CH_2SH$, $R_fC(O)NHCH_2CH_2OCH_2CH_2OH$, $R_fC(O)NHCH_2CH_2SCH_2CH_2OH$, $R_fC(O)NHCH_2CH_2NHCH_3$, $R_fCH_2OCH_2CH_2OH$, $R_fCH_2OCH_2CH_2OCH_2CH_2OH$, $R_fCH_2OCH_2CH_2NHCH_3$, $R_fCH_2CH_2OH$, $R_fCH_2CH_2OCH_2CH_2OH$, $R_fCH_2CH_2SCH_2CH_2OH$, and $R_fOCH_2CH_2OH$.

Preferred isocyanate reactive perfluoropolyethers include $C_3F_7O(CF(CF_3)CF_2O)_rCF(CF_3)C(O)NHCH_2CH_2OH$, $C_3F_7O(CF(CF_3)CF_2O)_rCF(CF_3)C(O)NHCH_2CH_2SH$, $C_3F_7O(CF(CF_3)CF_2O)_rCF(CF_3)C(O)NHCH_2CH_2NHCH_3$, $C_3F_7O(CF(CF_3)CF_2O)_rCF(CF_3)CH_2OCH_2CH_2OH$, $C_3F_7O(CF(CF_3)CF_2O)_rCF(CF_3)CH_2OCH_2CH_2OCH_2CH_2OH$, and $C_3F_7O(CF(CF_3)CF_2O)_rCF(CF_3)CH_2OCH_2CH_2NHCH_3$.

Useful epoxy-alcohols for preparing the epoxy-functionalized perfluoropolyether polyurethanes of the invention include, for example, glycidol, 2-methyl-2,3-epoxy-1-propanol, glycerol digylcidyl ether, 1,3-digylcidyl glyceryl ether, trimethylolpropane-diglycidyl ether, (3-hex-5-enyl-oxiranyl)-methanol, 1-(3-tert-butyl-oxiranyl)-propan-1-ol, (3-tert-butyl-oxiranyl)-cyclohexyl-methanol, 3-[2-tert-butyl-dimethyl-silanyloxy)-ethyl]-oxiranyl-methanol, 2-[1-oxiran-2-ylmethyl)piperidin-2-yl]ethanol, and 3-phenylglycidol Preferred epoxy-alcohols include glycidol, 2-methyl-2,3-epoxy-1-propanol, glycerol digylcidyl ether, 1,3-digylcidyl glyceryl ether, and trimethylolpropane-diglycidyl ether.

Depending on reaction conditions (e.g., reaction temperature and/or the type and amount of polyisocyanate used), a catalyst level of no greater than about 0.5% by weight, from about 0.00005% by weight to about 0.5% by weight, or even from about 0.02% by weight to 0.1% by weight of the reaction mixture may be used to effect the condensation reactions with the isocyanates. Tin compounds are preferred catalyst. Examples of useful tin compounds include tin II and tin IV salts such as stannous octonate, dibutyltin dilaurate, dibutyltin diacetate, dibutyltin di-2-ethylhexanoate, and dibutyltinoxide.

Typically, the reaction for the preparation of the epoxy-functionalized perfluoropolyether polyurethanes is conducted in a suitable solvent or mixed solvents. The reactants can be present in the solvent at any suitable concentration, e.g., from about 5% by weight to about 90% by weight based on the total weight of the reaction mixture. Illustrative examples of suitable solvents include aliphatic and alicyclic hydrocarbons (e.g., hexane, heptane, cyclohexane), aromatic solvents (e.g., benzene, toluene, xylene), ethers (e.g., diethylether, glyme, diglyme, diisopropyl ether), esters (e.g., ethyl acetate, butyl acetate, amyl acetate, n-butyl acetate, t-butyl acetate, Butyl CARBITOL™ Acetate ($C_4H_9O(C_2H_4O)_2C(O)CH_3$), Butyl CELLOSOLVE™ Acetate ($C_4H_9OCH_2CH_2OC(O)CH_3$), CELLOSOLVE™ Acetate ($C_2H_5OCH_2CH_2OC(O)CH_3$), methyl acetate, ethyl acetate, isopropyl acetate, isobutyl acetate, Methyl PROPASOL™ Acetate ($CH_3OCH_2CH(CH_3)OC(O)CH_3$), n-propyl acetate, n-butyl propionate, UCAR™ Ester EEP ($C_2H_5OC_2H_4OC(O)CH_2CH_3$), n-pentyl propionate, and dibasic esters such as dimethyl succinate, dimethyl glutarate, dimethyl adipate), ketones (e.g., acetone, methylethyl ketone, methyl isobutyl ketone), sulfoxides (e.g., dimethyl sulfoxide), amides (e.g., N,N-dimethylformamide, N,N-dimethylacetamide), halogenated solvents such as methyl chloroform, FREON 113, trichloroethylene, $CF_3$-Ph, 3M Novec™ solvents (e.g. $C_4F_9OCH_3$, $C_4F_9OCH_2CH_3$ or $C_2F_5CF(C_3F_7)$—$OCH_2CH_3$) and mixtures thereof.

The epoxy-functionalized perfluoropolyether polyurethanes of the invention are curable and can be cured as an epoxy resin. Alternatively, they can be cured as part of an epoxy resin composition.

Hardcoat Compositions

The hardcoat compositions of the invention comprise one or more epoxy silane compounds, one or more epoxy-functionalized perfluoropolyether polyurethane compounds, and photo-acid generator. The compositions may also comprise solvent.

Epoxy Silanes

The hardcoat compositions of the invention comprise curable epoxy silane compounds. Curable epoxy silanes are compounds or materials having at least one polymerizable epoxy group and at least one polymerizable silane group, the bridging of these groups being through a non-hydrolyzable aliphatic, aromatic, or aliphatic and aromatic divalent hydrocarbon linkage which may have N, O, and/or S atoms in the linkage chain. The O atoms for example would be within the chain only as ether or ester linkages. These linkage chains may be generally substituted as is well known in the art, as these substituents on the chain do not greatly affect the functional ability of the epoxy-terminated silanes to under the essential reactions necessary to polymerization through the siloxane or epoxy terminal groups. Examples of substituents which may be present on the linkage or bridging moieties are groups such as $NO_2$, $CH_3(CH_2)_nCH_2$, methoxy, ester, amide, urethane, ether and thioether, sulfone, halogen, and the like. In general structural formulae appearing within this description of the invention, such substitution of the bridging moieties is implied unless specifically excluded by language such as "unsubstituted divalent hydrocarbon radical".

The epoxy silane compounds may be monomeric, oligomeric, or polymeric. They may be, for example, acrylates, urethanes, ester-based, or the like.

The epoxy silane compounds can be of the general formula:

wherein:
E is an organic group having at least one oxirane ring;
$L_1$ is a divalent linkage;
$L_2$ is a divalent linkage;
Rj is multi-valent monomeric, oligomeric, or polymeric residue;
$Y_1$, $Y_2$ and $Y_3$ are each independently an alkyl group, aryl group or a hydrolysable group, wherein at least one of $Y_1$, $Y_2$ and $Y_3$ is a hydrolysable group; and
x is at least one and y is at least one.

Preferred epoxy silane compounds are of the following general formula:

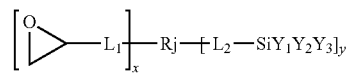

wherein $L_1$, $L_2$, Rj, $Y_1$, $Y_2$, $Y_3$, x, and y are defined as above.

Preferably the curable epoxy silane compounds are epoxy-terminated silane compounds having terminal polymerizable epoxy groups and terminal polymerizable silane groups, the bridging of these groups being as described above.

Useful epoxy-terminated silane compounds include epoxy-terminated alkoxy silanes of the following structure:

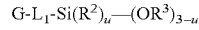

wherein:
$L_1$ is a divalent linkage,
$R^2$ and $R^3$ independently are $C_1$-$C_4$ alkyl groups,
G is a glycidoxy or epoxycyclohexyl group, and
u is 0 or 1.

Many epoxy-functional alkoxysilanes are suitable, including glycidoxymethyl-trimethoxysilane, glycidoxymethyltriethoxysilane, glycidoxymethyl-tripropoxysilane, glycidoxymethyl-tributoxysilane, β-glycidoxyethyltrimethoxysilane, β-glycidoxyethyltriethoxysilane, β-glycidoxyethyl-tripropoxysilane, β-glycidoxyethyl-tributoxysilane, β-glycidoxyethyltrimethoxysilane, α-glycidoxyethyl-triethoxysilane, α-glycidoxyethyl-tripropoxysilane, α-glycidoxyethyltributoxysilane, γ-glycidoxypropyl-trimethoxysilane, γ-glycidoxypropyl-triethoxysilane, γ-glycidoxypropyl-tripropoxysilane, γ-glycidoxypropyltributoxysilane, β-glycidoxypropyl-trimethoxysilane, β-glycidoxypropyl-triethoxysilane, β-glycidoxypropyl-tripropoxysilane, β-glycidoxypropyl-tributoxysilane, α-glycidoxypropyl-trimethoxysilane, α-glycidoxypropyl-triethoxysilane, α-glycidoxypropyl-tripropoxysilane, α-glycidoxypropyltributoxysilane, γ-glycidoxybutyl-trimethoxysilane, δ-glycidoxybutyl-triethoxysilane, δ-glycidoxybutyl-tripropoxysilane, δ-glycidoxybutyl-tributoxysilane, δ-glycidoxybutyl-trimethoxysilane, γ-glycidoxybutyl-triethoxysilane, γ-glycidoxybutyl-tripropoxysilane, γ-propoxybutyl-tributoxysilane, δ-glycidoxybutyl-trimethoxysilane, δ-glycidoxybutyl-triethoxysilane, δ-glycidoxybutyl-tripropoxysilane, α-glycidoxybutyl-trimethoxysilane, α-glycidoxybutyl-triethoxysilane, α-glycidoxybutyl-tripropoxysilane, α-glycidoxybutyl-tributoxysilane, (3,4-epoxycyclohexyl)-methyl-trimethoxysilane, (3,4-epoxycyclohexyl)methyl-triethoxysilane, (3,4-epoxycyclohexyl)methyl-tripropoxysilane, (3,4-epoxycyclohexyl)-methyl-tributoxysilane, (3,4-epoxycyclohexyl)ethyl-trimethoxysilane, (3,4-epoxycyclohexyl)ethyl-triethoxysilane, (3,4-epoxycyclohexyl)ethyl-tripropoxysilane, (3,4-epoxycyclohexyl)-ethyl-tributoxysilane, (3,4-epoxycyclohexyl)propyl-trimethoxysilane, (3,4-epoxycyclohexyl)propyl-triethoxysilane, (3,4-epoxycyclohexyl)propyl-tripropoxysilane, (3,4-epoxycyclohexyl)propyl-tributoxysilane, (3,4-epoxycyclohexyl)butyl-trimethoxysilane, (3,4-epoxycyclohexyl) butyl-triethoxysilane, (3,4-epoxycyclohexyl)-butyl-tripropoxysilane, and (3,4-epoxycyclohexyl)butyl-tributoxysilane.

Particularly preferred epoxyalkylalkoxysilanes are γ-glycidoxypropyl trimethoxy silane, γ-glycidoxypropylmethyldiethoxysilane and beta-(3,4-epoxycyclohexyl)ethyl-trimethoxysilane.

Examples of more epoxy-terminated silanes useful in the present invention are described, for example, in U.S. Pat. Nos. 4,049,861 and 4,293,606, and include compounds of the general formulae:

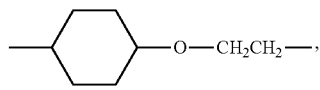

where R=a non-hydrolyzable divalent hydrocarbon radical (aliphatic, aromatic, or aliphatic and aromatic containing) of less than 20 carbon atoms or a divalent radical of less than 20 carbon atoms composed of C, H, N, S, and O atoms (these atoms are the only atoms which may appear in the backbone of the divalent radicals), the last being in the form of either linkages. No two heteroatoms may be adjacent within the backbone of the divalent hydrocarbon radical. This description defines divalent hydrocarbon radicals for epoxy terminated siloxanes in the practice of this invention. The value of n is from 0 to 1, $R^1$ is an aliphatic hydrocarbon radical of less than 10 carbon atoms, an acyl radical of less than 10 carbon atoms, or a radical of formula $(CH_2CH_2O)_kZ$ in which k is an integer of at least 1 and Z is an aliphatic hydrocarbon radical of less than 10 carbon atoms or hydrogen, m has values of 1 to 3.

The epoxy silanes used in this invention can be an epoxy silane of the above formula in which R is any divalent hydrocarbon radical such as methylene, ethylene, decalene, phenylene, cyclohexylene, cyclopentylene, methylcyclohexylene, 2-ethylbutylene, and allene or an ether radical such as $-CH_2-CH_2-O-CH_2-CH_2-$, $-(CH_2-CH_2O)_2-CH_2-CH_2-$, and $-CH_2O-(CH_2)_3-$, $R^1$ can be any aliphatic hydrocarbon radical of less than 10 carbon atoms such as methyl, ethyl, isopropyl, butyl, vinyl, alkyl, or any acyl radical of less than 10 carbon atoms such as formyl, acetyl, propionyl, or any radical of the formula $(CH_2CH_2O)_k Z$ in which k is an integer of at least 1, for example 2, 5, and 8, and Z is hydrogen or any aliphatic hydrocarbon radical of less than 10 carbon atoms such as methyl, ethyl, isopropyl, butyl, vinyl and allyl.

The following compounds are illustrative of some of the epoxy-terminated silanes that are useful in the present invention:

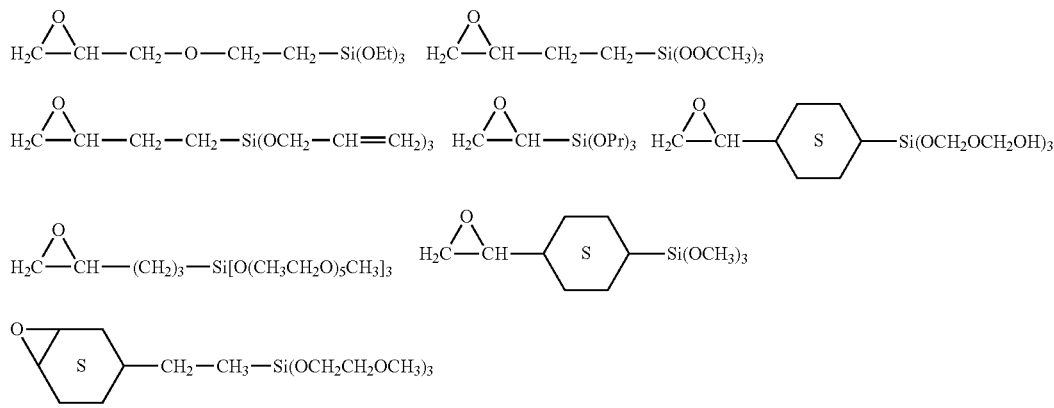

-continued

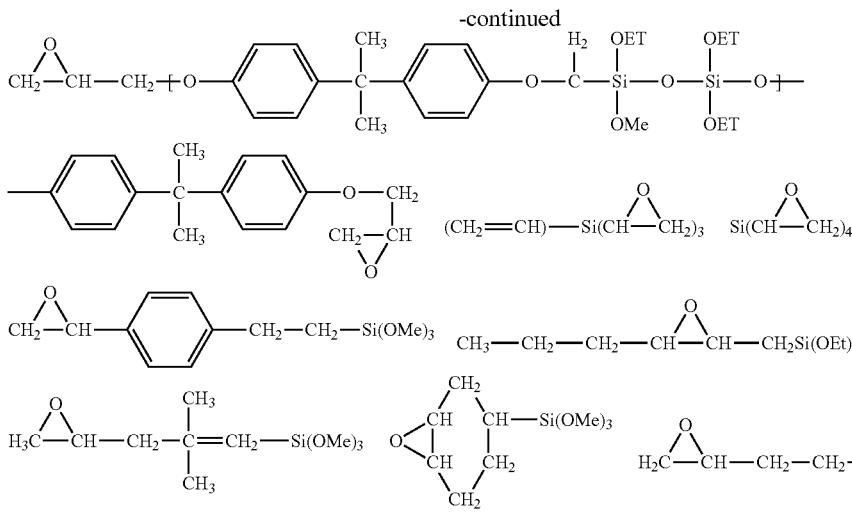

The preparation of most of the above epoxy-terminated silane compounds has been described in U.S. Pat. No. 3,131,161.

Other useful epoxy-terminated silanes are those of the formula:

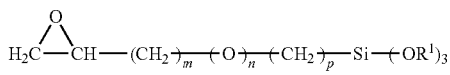

wherein
m is 1 to 6 (preferably 1 to 4),
n is 0 or 1 (preferably 1),
p is 1 to 6 (preferably 1 to 4), and
$R^1$ is H or alkyl of 1 to 10 carbon atoms (preferably alkyl of 1 to 4 carbon atoms).

In addition to any of the above epoxy silanes, partially hydrolyzed or condensated epoxy silane, which are further curable under photo-irradiation in the presence of photo-acid generator are useful in the present invention, alone or blended with non-hydrolyzed epoxy silane. These partial hydrolyzates can be formed by the partial hydrolysis of the silane $OR^1$ groups. Thus the term precondensate includes siloxanes in which some or all of the silicon atoms are bonded through oxygen atoms. Prepolymers are formed by the polymerization of groups other than the silanes as in U.S. Pat. Nos. 4,100,134 and 7,037,585.

Epoxy silanes typically comprise at least about 90% by weight of the hardcoat composition. Preferably, they comprise from about 90% by weight to about 98% by weight of the composition.

Epoxy-Functionalized Perfluoropolyether Polyurethane Compounds

The hardcoat compositions of the invention also comprise an epoxy-functionalized perfluoropolyether polyurethane compound described above. The epoxy silanes and the epoxy-functionalized perfluoropolyether polyurethane crosslink with themselves and with each other in the presence of acid generated, for example, by cationic photoinitiator, giving the composition durability. In addition, the fluorochemical imparts release properties.

The epoxy-functionalized perfluoropolyether polyurethane typically comprises from about 0.1% by weight to about 10% by weight of the composition (preferably, from about 0.5% by weight to about 5% by weight of the composition).

Photoacid Generator

Photoacid generators are cationic photoinitiators. The hardcoat compositions used in the present invention comprise a photoacid generator to cationically polymerize the composition using ultraviolet (UV) light. Useful cationic photoinitiators include diaryliodonium salts, triarylsulfonium salts benzylsulfonium salts, phenacylsulfonium salts, N-benzylpyridinium salts, N-benzylpyrazinium salts, N-benzylammonium salts, phosphonium salts, hydrazinium salts, and ammonium borate salts.

Useful cationic initiators for the purposes of this invention also include the aromatic onium salts, including salts of Group Va elements, such as phosphonium salts, for example, triphenyl phenacylphosphonium hexafluorophosphate, salts of Group VIa elements, such as sulfonium salts, for example, triphenylsulfonium tetrafluoroborate, triphenylsulfonium hexafluorophosphate and triphenylsulfonium hexafluoroantimonate, and salts of Group VIIa elements, such as iodonium salts such as diphenyliodonium chloride and diaryl iodonium hexafluoroantimonate, the latter being preferred. The aromatic onium salts and their use as cationic initiators in the polymerization of epoxy compounds are described in detail in U.S. Pat. No. 4,058,401, "Photocurable Compositions Containing Group VIA Aromatic Onium Salts," by J. V. Crivello issued Nov. 15, 1977; U.S. Pat. No. 4,069,055, "Photocurable Epoxy Compositions Containing Group VA Onium Salts," by J. V. Crivello issued Jan. 17, 1978, U.S. Pat. No. 4,101,513, "Catalyst For Condensation Of Hydrolyzable Silanes And Storage Stable Compositions Thereof," by F. J. Fox et al. issued Jul. 18, 1978; and U.S. Pat. No. 4,161,478, "Photoinitiators," by J. V. Crivello issued Jul. 17, 1979.

Examples of useful sulfonium salts include triphenylsulfonium tetrafluoroborate, triphenylsulfonium tetrakis(pentafluorobenzyl)borate, methyldiphenylsulfonium tetrafluoroborate, methyldiphenylsulfonium tetrakis (pentafluorobenzyl)borate, dimethylphenylsulfonium hexafluorophosphate, triphenylsulfonium hexafluorophosphate, triphenylsulfonium hexafluoroantimonate, diphenylnaphthylsulfonium hexafluoroarsenate, tritolysulfonium hexafluorophosphate, anisyldiphenylsulfonium hexafluorantimonate, 4-butoxyphenyldiphenylsulfonium tetrafluoroborate, 4-butoxyphenyldiphenylsulfonium tetrakis(pentafluorobenzyl)borate, 4-chlorophenyldiphenylsulfonium hexafluoroantimonate, tris(4-phenoxyphenyl)sulfonium hexafluorophosphate, di(4-ethoxyphenyl)methylsulfonium hexafluoroarsenate, 4-acetylphenyldiphenylsulfonium tetrafluoroborate, 4-acetylphenyldiphenylsulfonium tetrakis (pentafluorobenzyl)borate, tris(4-thiomethoxyphenyl)sulfonium hexafluorophosphate, di(methoxysulfonylphenyl)methylsulfonium hexafluoroantimonate, di(methoxynaphthyl)methylsulfonium tetrafluoroborate, di(methoxynaphthyl)methylsulfonium tetrakis(pentafluorobenzyl)borate, di(carbomethoxyphenyl)methylsulfonium hexafluorophosphate, (4-octyloxyphenyl)diphenylsulfonium tetrakis(3,5-bis-trifluoromethyl phenyl)borate, tris(dodecylphenyl)sulfonium tetrakis(3,5-bis-trifluoromethyl phenyl)borate, 4-acetamidophenyldiphenylsulfonium tetrafluoroborate, 4-acetamidophenyldiphenylsulfonium tetrakis (pentafluorobenzyl)borate, dimethylnaphthylsulfonium hexafluorophosphate, trifluoromethyldiphenylsulfonium tetrafluoroborate, trifluoromethyldiphenylsulfonium tetrakis (pentafluorobenzyl)borate, phenylmethylbenzylsulfonium hexafluorophosphate, 10-methylphenoxathiinium hexafluorophosphate, 5-methylthianthrenium hexafluorophosphate, 10-phenyl-9,9-dimethylthioxanthenium hexafluorophosphate, 1 0-phenyl-9-oxothioxanthenium tetrafluoroborate, 1 0-phenyl-9-oxothioxanthenium tetrakis(pentafluorobenzyl) borate, 5-methyl-I 0-oxothianthrenium tetrafluoroborate, 5-methyl-10-oxothianthrenium tetrakis(pentafluorobenzyl) borate, and 5-methyl-10,10-dioxothianthrenium hexafluorophosphate.

Examples of useful iodonium salts include di(dodecylphenyl)iodonium hexafluoroantimonate, di(dodecylphenyl)iodonium triflate, diphenyliodonium bisulfate, 4,4'-dichlorodiphenyliodonium bisulfate, 4,4'-dibromodiphenyliodonium bisulfate, 3,3'-dinitrodiphenyliodonium bisulfate, 4,4'-dimethyldiphenyliodonium bisulfate, 4,4'-bissuccinimidodiphenyliodonium bisulfate, 3-nitrodiphenyliodonium bisulfate, 4,4'-dimethoxydiphenyliodonium bisulfate, bis(dodecylphenyl)iodonium tetrakis (pentafluorophenyl)borate, (4-octyloxyphenyl)phenyliodonium tetrakis(3,5-bis-trifluoromethyl phenyl)borate, (tolylcumyl)iodonium tetrakis(pentafluorophenyl)borate $(CH_3C_6H_4)_2I—C(SO_2CF_3)_3$ as disclosed in U.S. Pat. No. 5,554,664; (C6H5)2I—B(C6F5)4 as disclosed in U.S. Pat. No. 5,514,728; and those disclosed in U.S. Pat. No. 5,340,898.

Other cationic initiators can also be used in addition to those referred to above; for example, the phenyldiazonium hexafluorophosphates containing alkoxy or benzyloxy radicals as substituents on the phenyl radical as described in U.S. Pat. No. 4,000,115, "Photopolymerization Of Epoxides," by Sanford S. Jacobs issued Dec. 28, 1976. Preferred cationic initiators for use in the compositions of this invention are the salts of Group VIa elements and especially the sulfonium salts, and also the Group VIIa elements, particularly the diaryl iodonium hexafluororantimonates. Particular cationic catalysts include diphenyl iodonium salts of tetrafluoro borate, hexafluoro phosphate, hexafluoro arsenate, and hexafluoro antimonate; and triphenyl sulfonium salts of tetrafluoroborate, hexafluoro phosphate, hexafluoro arsenate, and hexafluoro antimonate.

Preferred photo-acid generating salts useful in such compositions include (4-octyloxyphenyl)diphenylsulfonium tetrakis(3,5-bis-trifluoromethyl phenyl)borate, tris(dodecylphenyl)sulfonium tetrakis(3,5-bis-trifluoromethyl phenyl)borate, bis(dodecylphenyl)iodonium tetrakis(pentafluorophenyl)borate, (4octyloxyphenyl)phenyliodonium tetrakis(3,5-bis-trifluoromethyl phenyl)borate, and (tolylcumyl)iodonium tetrakis(pentafluorophenyl)borate. When such acid generating salts are used, they can provide sufficient electroconductivity for electrostatically-assisted coating. Advantageously, further electroconductivity enhancers are not typically required when using such salts, although they may also be used in conjunction with these preferred acid generating salts.

Particularly preferred onium salts are di(dodecylphenyl) iodonium hexafluoroantimonate and triarylsulfonium hexafluoroantimonate.

Cyracure™ UVI-6976 (a mixture of triarylsulfonium hexafluoroantimonate salts in propylene carbonate) and UVI-6992 are examples of cationic photoinitiators available from Dow Chemical. UVACURE 1600 (phenyl-p-octyloxyphenyl-iodonium hexafluoroantimonate) is available from Cytec Industries.

Cationic initiator is typically present in the compositions of the invention in a range from about 1% to about 5% by weight.

Optional Components

The hardcoat compositions can further comprise one or more multi-epoxide compounds (preferably, diepoxide compounds). Multi-epoxide compounds can, for example, accelerate polymerization of the composition. They can also be used to adjust the coating properties, for example hardness and toughness of the cured composition.

Useful multi-epoxide compounds include 4,4'-methylenebis(N,N-diglycidlaniline), triglycidyl isocyanurate, glycerol triglycidyl ether, N,N-diglycidyl-4-glycidyloxyaniline, triphenylolmethane triglycidyl ether, trimethylolpropane triglycidyl ether, glycerol propoxylane triglycidyl ether, isocyanuric acid (R,R,R)-triglycidyl ether, 1,1,1-tris(4-hydroxyphenyl)-ethane triglycidyl ether, anaxirone, and teroxirone.

Useful di-epoxide compounds include 1,2,5,6-diepoxycyclooctane, 1,3-butane diepoxide, 1,2,7,8-diepoxyoctane, 1,2,9,10-diepoxydecane, 1-methyl-4-(2-methyloxiranyl)-7-oxabicyclo[4.1.0]hetane, 4-vinylcyclohexene dioxide, 1,3-bis(glycidoxypropyl)tetramethyldisiloxane, diglycidyl ether, 1,4-butanediol diglycidyl ether, 1,6-hexanediol diglycidyl ether, 1,3-butanediol diglycidyl ether, ethylene glycol diglycidyl ether, neopentyl glycol diglycidyl ether, 1,4-cyclohexanedimethanol diglycidyl ether, diethylene glycol diglycidyl ether, bisphenol A diglycidyl ether, bisphenol F diglycidyl ether, resorcinol diglycidyl ether, glycerol diglycidyl ether, 1,3-diglycidyl glyceryl ether, propylene glycol diglycidyl ether, trimethylolpropane diglycidyl ether, 1,2-cyclohexanedicarboxylic acid diglycidyl ester, 3,4-epoxy-6-methylcyclohexylmethyl-3,4-epoxy-6-methylcyclohexanecarboxylate, dicyclopentadiene diepoxide, 3,4-epoxycyclohexylmethyl 3,4-epoxycyclohexanecarboxylate, 1,4-bis(glycidyloxy)benzene, bis(3,4-epoxycyclohexylmethyl) adipate, 2,6-di(oxiran-2-ylmethyl)-1,2,3,5,6,7-hexahydropyrrolo[3,4-f]isoindole-1,3,5,7-tetraone, epipropidine, diglycidyl-iso-phthalane, 1,4-bis(2',3'-epoxypropyl) perfluoro-1-butane, N,N'-bis(2,3-epoxypropyl)piperazine, bis[2-(3,4-epoxycyclohexyl)ethyl]tetramethyldisiloxane, and santolink XI-100.

Suitable diepoxide comonomers include those disclosed in U.S. Pat. No. 4,293,606 (Zollinger et al.) of the formula:

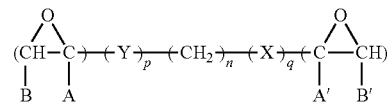

wherein n=1 to 6, X and Y independently represent (1) —O—$(CH_2)_m$—, wherein m=1 or 2 and the terminal carbon atom of this group is directly connected to the carbon of the epoxy group, or

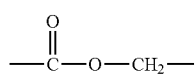
(2)

with the bond from the carbonyl carbon atom directly connected to the bridging group —$(CH_2)_n$—, p+q=1 or 2 and p and q are independently 0 or 1, A and B, and A' and B' are independently H or, when fused together as A and B or A' and B', the atoms necessary to form a 5- or 6-membered cycloaliphatic ring, and

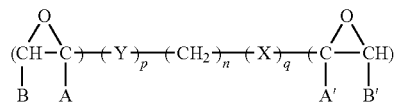

wherein A and B and A' and B' are as defined above, X and Y are as defined above and n, p, and q are independently integers of 1 to 6.

Preferably, the diepoxide comonomer is a cycloaliphatic diepoxide compound. Preferred diepoxide compounds are 3,4-epoxycyclohexylmethyl-3,4-epoxycyclohexanecarboxylate and bis(3,4-epoxycyclohexylmethyl)adipate.

Diepoxide resins are commercially available from Dow Chemical Company as D.E.R.™ 732 and 736 epoxy resins. Multi-epoxide resins are commercially available from Dow Chemical Company as D.E.R.™ 354 epoxy resin and D.E.N.™ epoxy novolac resins 431, 438, and 439.

If used, diepoxide or multi-epoxide comonomers are typically present in the compositions of the invention in amounts of less than about 40% by weight.

The hardcoat compositions of the invention may also comprise other optional components such as, for example, curable mono- and/or di-silanes (for example, to adjust hardness), surfactant, matting agents, inorganic particles, and the like.

In another aspect, the protective coating compositions may also comprise a fluorinated compound disclosed herein and a crosslinkable compound (for example, for coating hardness adjustment) represented by formula:

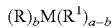

wherein
R is selected from the group consisting of alkyl, aryl, arylalkylenyl, and alkylarylenyl;
M is selected from the group consisting of Si, Ti, Zr, and Al (preferably, M is Si),
$R^1$ is hydrolysable group selected from the group consisting of halide, hydroxyl, alkoxy, aryloxy, acyloxy, and polyalkyleneoxy;
a is 3 or 4; and
b is 0, 1, or 2.

Representative compounds of this formula include tetramethoxysilane, tetraethoxysilane, methyltriethoxysilane, dimethyldiethoxysilane, octadecyltriethoxysilane, methyltrichlorosilane, tetramethyl orthotitanate, tetraethyl orthotitanate, tetraisopropyl orthotitanate, tetraethylzirconate, tetraisopropylzirconate, and tetrapropylzirconate.

If used, the crosslinkable silanes are typically present in the compositions of the invention in amounts of less than about 40% by weight.

The protective coating compositions may comprise a fluorinated additive disclosed herein and one or more crosslinkable multi-epoxides as well as one or more crosslinkable silanes.

Preferably, the coating compositions of the invention are solvent-free. In some embodiments, however, the coating compositions comprise solvent such as, for example, ketones (for example, acetone or methyl isobutyl ketone (MIBK)), esters (for example, ethyl acetate, methyl isobutyl ether, or propylene carbonate), or ethers (for example, methyl tert-butyl ether (MTBE) or tetrahydrofuran (THF)), or combinations.

Method and Articles

The hardcoat compositions of the invention can be applied to a substrate using any suitable method or technique including, e.g., spraying, brushing, wiping, knife coating, notch coating, reverse roll coating, gravure coating, soaking, dip coating, bar coating, flood coating, spin coating and combinations thereof, and in any suitable form including a continuous or discontinuous layer. The resulting hardcoat can likewise be in a variety of forms including, e.g., a continuous or discontinuous layer (e.g., in a pattern, dots, stripes and swirls) and can be the result of multiple layers disposed on top of one another. The resulting hardcoat is relatively durable, more resistant to contamination and easier to clean than the substrate surface itself.

The hardcoat composition can be applied at any thickness to provide the desired level of water, oil, stain, and soil repellency. The hardcoat is preferably present on a substrate in an amount that does not substantially change the appearance and optical characteristics of the underlying substrate. Typically, if the hardcoat composition is to be used as the sole hard-coat, the thickness of the dried cured coating is from 1 micron to 100 microns, from 1 micron to 10 microns, or even from 2 microns to 5 microns. If the hardcoat composition is applied as the top layer of at least two layers (e.g., the at least two layers may be of a composition that is the same or different from each other and from the hard-coat coating composition), the hardcoat top layer may be applied as a much thinner layer. Such hardcoat top layer, when dry, may be of a thickness of, e.g., 20 Angstroms to 1 micron, or even from 40 nanometers to 100 nanometers. A useful total thickness for the hardcoat (which includes all layers in a multiple layer coating) can be any suitable thickness including, e.g., from about 1 micron to about 5 microns.

The hardcoat composition can be coated on a substrate (e.g., plastic or glass) and at least partially cured to provide a coated article. Any optional solvent present is typically at least partially removed (e.g., using a forced air oven, through evaporation at elevated and ambient temperatures, and combinations thereof), and the composition is then at least partially cured to form a durable coating.

The hardcoat composition can also be coated on a primed surface of a substrate (e.g., a plastic substrate or a glass substrate). The primer layer can be in the form of a continuous or discontinuous layer (e.g., in a pattern, dots, stripes and swirls), a single layer, multiple primer layers disposed on top of one another, and combinations thereof.

The hardcoat compositions of the invention can be used to provide durability, clarity, stain- and soil-resistance, water- and soil-repellency, easy-cleaning, and/or release properties to a hard substrate such as, for example, a substrate comprising natural stone, man-made stone, ceramic, vinyl, wood, masonry, cork, glass, or the like. The hardcoat composition can be applied using coating techniques known in the art, and then cured (that is, cationically polymerized) using ultraviolet light. Typically, when the protective coating is used on a hard substrate, the protective layer will be between about 0.1 mils and about 2 mils thick, but suitable thicknesses will depend upon the application.

The hardcoat compositions described above are particularly useful for forming a protective layer on phototools to provide scratch- and abrasion-resistance, as well as release properties. Phototools are typically made using a computer-aided design (CAD) system to prepare data for an exposure apparatus (for example, a photo-plotter) based on a target blueprint or data. Then, this data is used to perform direct writing of a designed pattern (for example, a circuit pattern) onto an emulsion photographic dry plate, which has been prepared by forming a film surface of a photosensitive emulsion layer on an optically clear substrate (for example, a glass substrate, fused silica or polyethylene terephthalate (PET), polycarbonate, or poly(methyl)methacrylate substrate). Optically clear substrates typically have low haze (for example, less than about 5% or even less than about 2%) and are substantially transparent (that is, they typically allow the passage of 95% or more (preferably 98% or more) of visible and ultraviolet light. The photographic dry plate with the pattern thereon is then developed, fixed, washed in water, and dried. It may then be examined for defects and, if necessary, retouched.

The photosensitive emulsion layer typically comprises a silver halide emulsion or a diazo emulsion. Thus, the film surface is relatively soft and easily scratched or marked. Chrome metal absorbing film may also be used.

The hardcoat compositions of the invention can be coated on the substrate of the phototool by any useful coating technique known in the art. The hardcoat composition can then be cured on the phototool using UV light to form the protective layer. Typically, the protective layer comprising the cured hardcoat composition will be from about 0.5 microns to about 40 microns thick; preferably, from about 2 microns to about 15 microns thick; more preferably, from about 2 microns to about 10 microns thick.

EXAMPLES

Objects and advantages of this invention are further illustrated by the following examples, but the particular materials and amounts thereof recited in these examples, as well as other conditions and details, should not be construed to unduly limit this invention. Unless otherwise indicated to the contrary, all weights are based on percent by weight.

Materials

Materials utilized in the examples are shown in Table 1.

TABLE 1

| Material Description | |
| --- | --- |
| Material | Supplier |
| Water | Millipore Corporation, Billerica, MA |
| Acetone | EMD Chemicals Inc., Gibbstown, NJ |
| Toluene | EMD Chemicals Inc., Gibbstown, NJ |
| A-186, β-(3,4-epoxycyclohexyl)ethyltrimethoxysilane | GE Advanced Materials, Albany, NY |
| EtOAc, Ethyl acetate | J.T. Baker, Phillipsburg, NC |
| MEK, Methyl ethyl ketone | EMD Chemicals Inc., Gibbstown, NJ |

TABLE 1-continued

| Material Description | |
| --- | --- |
| Material | Supplier |
| DMF, N,N-dimethylformamide | Sigma-Aldrich, St. Louis, MO |
| DBTDL, Dibutyltin dilaurate catalyst | Sigma-Aldrich, St. Louis, MO |
| HFPO—OH, HFPO—C(O)N(H)CH$_2$CH$_2$OH | 3M Company, St. Paul, MN |
| A-187, γ-Glycidoxypropyltrimethoxysilane | GE Advanced Materials, Albany, NY |
| GDGE, Glycerol diglycidyl ether | Sigma-Aldrich, St. Louis, MO |
| PI, Photoinitiator, Cyracure ™ UVI-6974, triarylsulphonium hexafluoroantimonate, 50% in propylene carbonate | Union Carbide Company, Houston, TX |
| GPTE, Glycerol propoxylate triglycidyl ether | Sigma-Aldrich, St. Louis, MO |
| N100 and N3300, Polyisocyanate Desmodur ® | Bayer Polymers LLC, Pittsburgh, PA |
| TEOS, Tetraethyl orthosilicate, Si(OC$_2$H$_5$)$_4$ | Sigma-Aldrich, St. Louis, MO |
| Di-Epoxide, 1,4-Cyclohexanedimethanol diglycidyl ether | Sigma-Aldrich, St. Louis, MO |
| ERL-4299, Bis-(3,4-epoxycyclohexylmethyl) adipate | Dow Chemical Company, Midland, MI |

Test Methods

Contact Angle Measurement

Coated films were rinsed for 1 minute with hand agitation in an isopropanol (IPA) bath prior to water and hexadecane (HD) contact angles measurements. Measurements were made using a VCA-2500XE video contact angle analyzer available from AST Products (Billerica, Mass.). Reported values are the average of at least 3 drops; each drop was measured twice. Drop volumes were 5 μL for static measurements and 1-3 μL for advancing and receding. For HD, only advancing and receding contact angles are reported because static and advancing values were found to be nearly equal.

Steel Wool Durability Test

Abrasion resistance of cured films was tested cross-web to the coating direction by use of a mechanical device capable of oscillating steel wool fastened to a stylus across the film's surface. The stylus oscillated over a 10 cm wide sweep at a rate of 3.5 wipes/second. A wipe is defined as a single travel of 10 cm. The stylus had a flat, cylindrical geometry with a diameter of 3.8 mm having a 400 g load. The steel wool was obtained from Rhodes-American a division of Homax Products, Bellingham, Wash. under the trade designation "#0000-Super-Fine" and was used as received. Each composition was tested once, with each test consisting of 50 wipes with the 400 g load. After each test, the water and HD contact angle were measured.

Solvent Resistant Test

One drop (approximately 1.25 cm diameter) of an organic solvent was placed on the cured coatings. The solvent was allowed to evaporate to dryness at room temperature and the coating was visually rated. A rating of "C" indicated a clear surface without observable damage to the coating.

Examples

Epoxy-Silane Formulations

Representative epoxy-silane (ES) coating formulations were prepared by mixing the components in the following weight ratios.

ES-1: A-187/ERL-4299/PI, 89/2/9
ES-2: A-186/GPTE/PI, 86/5/9

Preparation of Epoxy Functionalized Perfluoropolyether Polyurethanes Additives (FA)

FA-1 (HFPO—OH/N100/GDGE, 2.5/30/27.5 Equivalent Ratio)

To a 4 oz. bottle, 5.73 g N100, 3.29 g HFPO—OH, 5.62 g GDGE, 34.1 g EtOAc solvent, and 4 drops of DBTDL catalyst were added. This solution was reacted at 70° C. under nitrogen with magnetic stirring for 4 hours. A clear solution was obtained. Fourier transform infrared spectroscopy (FTIR) analysis indicated no unreacted —NCO remained.

FA-2 (HFPO—OH/N3300/GDGE in 5/30/25 Equivalent Ratio)

To a 4 oz. bottle, 5.73 g N100, 6.57 g HFPO—OH, 5.10 g GDGE, 40.6 g EtOAc solvent and 4 drops of DBTDL catalyst were added. This solution was reacted at 70° C. under nitrogen with magnetic stirring for 4 hours. A clear solution was obtained. FTIR analysis indicated no unreacted —NCO remaining.

Comparative Perfluoropolyether Diepoxide, LTM-DE

average MW ~2,000) was prepared based on Example XIV, U.S. Pat. No. 4,094,911.

Epoxy-Silane Hardcoat

Epoxy functionalized perfluoropolyether polyurethane additives (FA) were mixed with the ES formulations at different levels. These formulations were coated on primed polyester film with a #6 wire rod and cured with a 2 minute exposure to 2 Sylvania Germicidal G15T8 (15W) bulbs in air. The coating quality was visually assessed and the contact angles were measured on several representative coating examples, with the results summarized in Tables 2 and 3.

TABLE 2

Hardcoat Compositions

| Formulation Number | Formulation Composition | Coating Quality | Water Adv/Rec/Static | | | Hexadecane Adv/Rec/Static | | |
|---|---|---|---|---|---|---|---|---|
| C1 | 100% ES-1 (no FA) | Excellent | 86 | 38 | 83 | 21 | 12 | 19 |
| C2 | 100% ES-2 (no FA) | Good | 77 | 44 | 68 | 12 | 4 | 10 |
| C3 | ES-1/HFPO-OH (99/1) | Dewet | N/A | N/A | N/A | N/A | N/A | N/A |
| C4 | ES-2/HFPO-OH (99/1) | Dewet | N/A | N/A | N/A | N/A | N/A | N/A |
| C5 | ES-1/LTM-DE (99/1) | Dewet | N/A | N/A | N/A | N/A | N/A | N/A |
| E1 | ES-1/FA-1 (99.5/0.5) | Excellent | 110 | 58 | 102 | 74 | 69 | 73 |
| E2 | ES-1/FA-1 (99/1) | Excellent | 109 | 51 | 104 | 72 | 51 | 72 |
| E3 | ES-2/FA-1 (99/1) | Excellent | 111 | 64 | 107 | 74 | 67 | 72 |
| E4 | ES-1/FA-1 (95/5) | Excellent | 110 | 49 | 105 | 69 | 52 | 66 |
| E5 | ES-1/FA-2 (98/2) | Good | 117 | 57 | 113 | 75 | 61 | 73 |

N/A: not measured.

In comparison with the controls (C1 and C2), in which no FA was added, the addition of 0.5%~5% FA-1 or FA-2 significantly improved the water and oil repellency. Also, the polyurethane based perfluoropolyether epoxides showed good and excellent compatibility with epoxysilane hardcoat, while the coating formulated with simple perfluoropolyethers, HFPO—OH(C3 and C4) and LTM-DE (C5) were dewet.

TABLE 3

Hardcoat Compositions With Additional Cross-linker

| Formulation Number | Formulation Composition | Water Adv/Rec/Static | | | Hexadecane Adv/Rec/Static | | | Coating Quality |
|---|---|---|---|---|---|---|---|---|
| E6[a] | ES-1/FA-1/TEOS (93/2/5) | 114 | 60 | 111 | 73 | 69 | 71 | Fair |
| E7[a] | ES-1/FA-1/TEOS (83/2/15) | 115 | 60 | 111 | 73 | 64 | 72 | Excellent |
| E8[a] | ES-1/FA-1/TEOS (73/2/25) | 112 | 54 | 107 | 71 | 45 | 69 | Excellent |
| E9 | ES-1/FA-2/TEOS (93/2/5) | 115 | 65 | 106 | 73 | 63 | 71 | Excellent |
| E10 | ES-1/FA-1/Di-epoxide (93/2/5) | 113 | 61 | 110 | 74 | 65 | 72 | Good |
| E11 | ES-1/FA-1/Di-epoxide (88/2/10) | 110 | 58 | 108 | 73 | 62 | 72 | Good |
| E12 | ES-1/FA-1/Di-epoxide (78/2/20) | 114 | 61 | 109 | 73 | 66 | 71 | Good |
| E13 | ES-1/FA-2/Di-epoxide (93/2/5) | 116 | 67 | 113 | 73 | 67 | 71 | Good |
| E14 | ES-2/FA-2/TEOS (93/2/5) | 116 | 62 | 112 | 73 | 59 | 70 | Good |
| E15 | ES-2/FA-2/Di-epoxide (93/2/5) | 117 | 62 | 111 | 73 | 64 | 71 | Excellent |

[a]Coated as 50% solids in MEK

From Table 3, no significant effect on low surface energy has been observed with up to 20% crosslinker, indicating the possibility to adjust the coating formulation for broad applications.

Steel wool scratch durability was tested on representative coated films. Scratch durability, as well as contact angle measurements on the abraded film, are shown in Table 4.

TABLE 4

Steel Wool Durability

| Formulation | Visible Scratches | H$_2$O Adv/Rec/Static | | | HD Adv/Rec/Static | | |
|---|---|---|---|---|---|---|---|
| E3 | No | 107 | 44 | 101 | 61 | 42 | 62 |
| E6[a] | No | 107 | 45 | 105 | 69 | 47 | 66 |
| E5 | No | 115 | 54 | 111 | 77 | 57 | 73 |
| E9 | No | 112 | 60 | 109 | 70 | 54 | 69 |
| E13 | No | 111 | 62 | 107 | 71 | 54 | 69 |

[a]Coated as 50% solids in MEK

The inventive formulations demonstrate good scratch resistance. Contact angles did not decrease significantly after steel wool abrasion test.

Solvent resistance of representative inventive coatings was tested, with the results shown in Table 5.

TABLE 5

Solvent resistant Test

| | Solvent | | | | | |
|---|---|---|---|---|---|---|
| Formulation | EtOAc | IPA | Acetone | Toluene | MEK | DMF |
| E2 | C | C | C | C | C | C |
| E3 | C | C | C | C | C | C |
| E4 | C | C | C | C | C | C |
| E5 | C | C | C | C | C | C |
| E6 | C | C | C | C | C | C |
| E8 | C | C | C | C | C | C |
| E9 | C | C | C | C | C | C |
| E13 | C | C | C | C | C | C |
| E14 | C | C | C | C | C | C |

The complete disclosures of the publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A phototool comprising an optically clear substrate having a designed pattern, and a protective layer on at least a portion of the substrate; wherein the protective layer comprises an at least partially cured hardcoat composition; wherein the hardcoat composition comprises:
   (a) one or more epoxy silane compounds;
   (b) one or more epoxy-functionalized perfluoropolyether polyurethane compounds; and
   (c) photo-acid generator;
wherein the epoxy-functionalized perfluoropolyether polyurethane compound has the following general structure:

wherein:
   R$_f$ is a monovalent perfluoropolyether moiety;
   Q is independently a connecting group of valence at least 2, which may contain heteroatoms;
   X$_1$ is O, S or NR, wherein R is H or a lower alkyl of 1 to 4 carbon atoms;
   R$_i$ is a residue of a multi-isocyanate;
   X$_2$ is O, S, or NR, wherein R is a lower alkyl of 1 to 4 carbon atoms;
   E is an organic group having at least one oxirane ring;
   m is at least 1; n is at least 1; o is 1, 2 or 3; and
   m+n is from 2 to 10.

2. The phototool of claim 1 wherein R$_f$ is the oligomer of hexafluoropropylene oxide having a number average molecular weight of 1,000 or higher.

3. The phototool of claim 1 wherein the epoxy-functionalized perfluoropolyether polyurethane compound is selected from the group consisting of

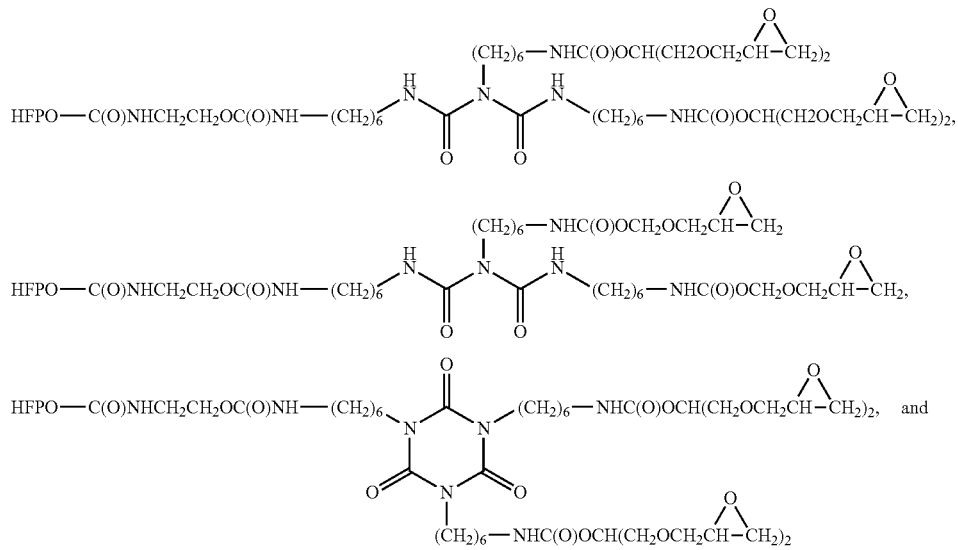

-continued

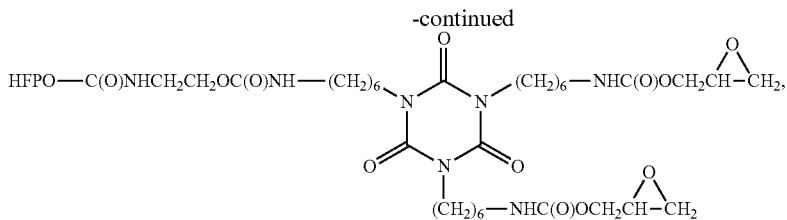

wherein HFPO is an oligomer of hexafluoropropylene oxide having a number average molecular weight of at least about 1000.

4. The phototool of claim 1 wherein the epoxy silane compound is an epoxy-terminated silane compound having the general formula:

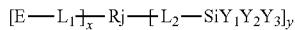

wherein:
E is an organic group having at least one oxirane ring;
$L_1$ is a divalent linkage;
$L_2$ is a divalent linkage;
Rj is multi-valent monomeric, oligomeric, or polymeric residue;
$Y_1$, $Y_2$ and $Y_3$ are each independently an alkyl group, aryl group or a hydrolysable group, wherein at least one of $Y_1$, $Y_2$ and $Y_3$ is a hydrolysable group; and
x is at least one and y is at least one.

5. The phototool of claim 1 wherein the epoxy silane compound is selected from the group consisting of γ-glycidoxypropyl trimethoxy silane, γ-glycidoxypropyl triethoxy silane, γ-glycidoxypropylmethyldiethoxysilane, and β-(3,4-epoxycyclohexyl)ethyl-trimethoxysilane.

6. The phototool of claim 1 wherein the hardcoat composition further comprises one or more curable silane compounds.

7. The phototool of claim 6 wherein the curable silane compound has the following general structure:

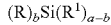

wherein
R is selected from the group consisting of alkyl, aryl, arylalkylenyl, and alkylarylenyl;

$R^1$ is a hydrolysable group selected from the group consisting of halide, hydroxyl, alkoxy, aryloxy, acyloxy, and polyalkyleneoxy;
a is 3 or 4; and
b is 0, 1, or 2.

8. The phototool of claim 1 wherein the hardcoat composition further comprises one or more multi-epoxide compounds.

9. The phototool of claim 8 wherein the hardcoat composition further comprises one or more cycloaliphatic diepoxide compounds.

10. The phototool of claim 1 wherein the hardcoat composition further comprises one or more curable silane compounds and one or more multi-epoxide compounds.

11. The phototool of claim 1 wherein the epoxy-functionalized perfluoropolyether polyurethane compound comprises from about 0.1% by weight to about 10% by weight of the hardcoat composition.

12. The phototool of claim 11 wherein the epoxy-functionalized perfluoropolyether polyurethane compound comprises from about 0.5% by weight to about 5% by weight of the hardcoat composition.

13. The phototool of claim 1 wherein the substrate comprises an exposed and developed photosensitive emulsion patterned layer.

14. The phototool of claim 1 wherein the protective layer is from about 0.5 microns to about 40 microns thick.

15. A method of making a printed circuit comprising placing the phototool of claim 1 on a photoresist layer, exposing the photoresist layer and phototool to high intensity light, and removing the phototool from the photoresist layer.

16. The method of claim 15 wherein the photoresist layer further comprises solder mask ink.

17. The method of claim 15 wherein the method is repeated 5 times or more.

* * * * *

UNITED STATES PATENT AND TRADEMARK OFFICE
CERTIFICATE OF CORRECTION

PATENT NO. : 8,420,281 B2
APPLICATION NO. : 12/561113
DATED : April 16, 2013
INVENTOR(S) : Zai-Ming Qiu Page 1 of 2

It is certified that error appears in the above-identified patent and that said Letters Patent is hereby corrected as shown below:

Title Page, Column 2 (Other Publications)
Line 13, Delete "[retrived" and insert -- [retrieved --, therefor.

Title Page 2, Column 2 (Other Publications)
Line 9, Delete "Choognam," and insert -- Chungnam, --, therefor.

In the Specification:

Column 2
Line 42, Delete "55';" and insert -- 55°; --, therefor.

Column 7
Line 4, Delete "digylycidyl" and insert -- diglycidyl --, therefor.

Line 4, Delete "digylcidyl" and insert -- diglycidyl --, therefor.

Lines 9 – 10, Delete "phenylglycidol" and insert -- phenylglycidol. --, therefor.

Line 12, Delete "digylycidyl" and insert -- diglycidyl --, therefor.

Line 12, Delete "digylcidyl" and insert -- diglycidyl --, therefor.

Columns 11-12
Line 1, Delete

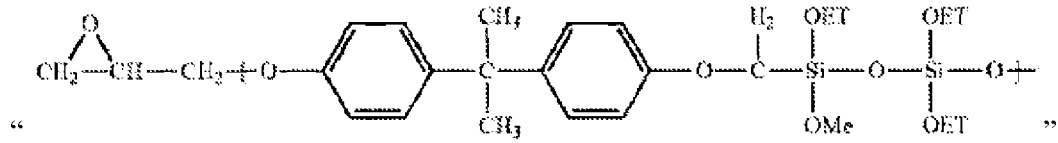

" and insert

Signed and Sealed this
Sixth Day of August, 2013

Teresa Stanek Rea
*Acting Director of the United States Patent and Trademark Office*

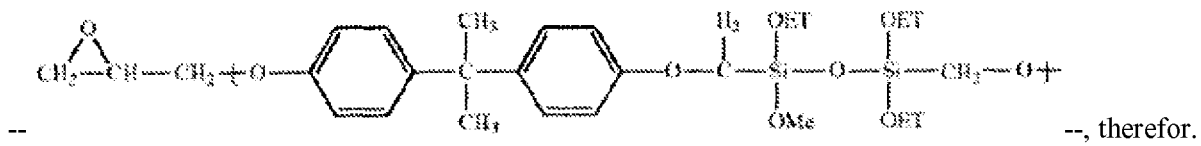 --, therefor.

Line 3, (2nd. Structure),

Delete " CH₃—CH₂—CH₂—CH—CH—CH₂Si(OEt)₃ " and insert -- CH₃—CH₂—CH₂—CH—CH—CH₂Si(OEt)₃ --, therefor.

Column 12
Lines 65-66, Delete "hexafluorantimonate," and insert -- hexafluoroantimonate, --, therefor.

Column 13
Line 56, Delete "hexafluororantimonates." and insert -- hexafluoroantimonates. --, therefor.

Column 14
Line 29, Delete "diglycidlaniline)," and insert -- diglycidylaniline), --, therefor.

Column 18
Line 17, Delete "triarylsulphonium" and insert -- triarylsulfonium --, therefor.

Column 20
Line 11, Delete "average" and insert -- (LTM-DE, average --, therefor.